(12) United States Patent
Yoshizawa et al.

(10) Patent No.: US 11,361,412 B2
(45) Date of Patent: Jun. 14, 2022

(54) IMAGE EXPOSURE DEVICE, IMAGE EXPOSURE METHOD, AND PROGRAM

(71) Applicant: FUJIFILM Corporation, Tokyo (JP)

(72) Inventors: Hirotoshi Yoshizawa, Kanagawa (JP); Shinichiro Sonoda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/005,330

(22) Filed: Aug. 28, 2020

(65) Prior Publication Data
US 2020/0394768 A1 Dec. 17, 2020

Related U.S. Application Data

(63) Continuation of application No. PCT/JP2019/005531, filed on Feb. 15, 2019.

(30) Foreign Application Priority Data

Mar. 30, 2018 (JP) .............................. JP2018-069107

(51) Int. Cl.
*G06T 5/00* (2006.01)
*H04N 5/235* (2006.01)
(Continued)

(52) U.S. Cl.
CPC ............. *G06T 5/004* (2013.01); *H04N 5/238* (2013.01); *H04N 5/2353* (2013.01); *H04N 5/243* (2013.01)

(58) Field of Classification Search
CPC ...... G06T 5/004; H04N 5/2353; H04N 5/238; H04N 5/243
See application file for complete search history.

(56) References Cited

U.S. PATENT DOCUMENTS 4,918,534 A * 4/1990 Lam ..................... H04N 5/2351
348/162
9,126,396 B2 9/2015 Degani et al.
(Continued)

FOREIGN PATENT DOCUMENTS

CN 106797453 5/2017
EP 0997776 5/2000
(Continued)

OTHER PUBLICATIONS

Office Action of Japan Counterpart Application, with English translation thereof, dated Mar. 2, 2021, pp. 1-7.
(Continued)

*Primary Examiner* — Ahmed A Berhan
(74) *Attorney, Agent, or Firm* — JCIPRNET

(57) ABSTRACT

The image exposure device includes an image display device that has a plurality of pixels and radiates light according to a display image represented by the plurality of pixels; a support portion that supports a photosensitive recording medium for recording a recorded image according to the display image in a state in which an exposure surface of the photosensitive recording medium faces the image display device; a louver film that is provided between the image display device and the support portion, and limits an angle of the light radiated from the image display device to the photosensitive recording medium; and a controller that controls the image display device to display the display image in which an image quality of an input image represented by input image data is deteriorated by emphasizing a density difference of a high-frequency component of the input image.

15 Claims, 10 Drawing Sheets

(51) Int. Cl.
*H04N 5/238* (2006.01)
*H04N 5/243* (2006.01)

(56) References Cited

U.S. PATENT DOCUMENTS

| | | | |
|---|---|---|---|
| 2001/0033370 A1 | 10/2001 | Enomoto et al. | |
| 2008/0050032 A1* | 2/2008 | Okuno | G06T 5/003 382/266 |
| 2015/0138526 A1* | 5/2015 | Degani | G02B 5/005 355/77 |
| 2017/0064204 A1* | 3/2017 | Sapiro | G06T 5/50 |
| 2017/0094241 A1 | 3/2017 | Fujiwara et al. | |

FOREIGN PATENT DOCUMENTS

| | | |
|---|---|---|
| JP | H0284888 | 3/1990 |
| JP | 2001235802 | 8/2001 |
| JP | 2004109615 A * | 4/2004 |
| JP | 2006246080 | 9/2006 |
| JP | 2009025621 | 2/2009 |
| JP | 2009037011 | 2/2009 |
| JP | 2016224259 | 12/2016 |

OTHER PUBLICATIONS

Office Action of China Counterpart Application, with English translation thereof, dated May 21, 2021, pp. 1-13.

"International Search Report (Form PCT/ISA/210) of PCT/JP2019/005531," dated Apr. 2, 2019, with English translation thereof, pp. 1-5.

"International Preliminary Report On Patentability (Form PCT/IPEA/409) of PCT/JP2019/005531," completed on Oct. 21, 2019, with English translation thereof, pp. 1-14.

"Office Action of China Counterpart Application" with English translation thereof, dated Nov. 15, 2021, p. 1-p. 12.

"Office Action of Japan Counterpart Application" with English translation thereof, dated Sep. 21, 2021, p. 1-p. 7.

* cited by examiner

FIG. 5
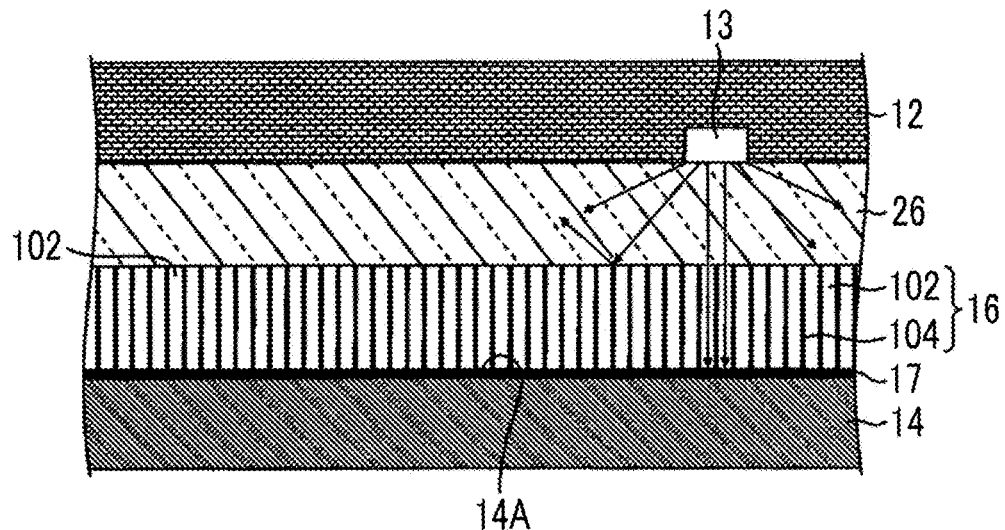
FIG. 6
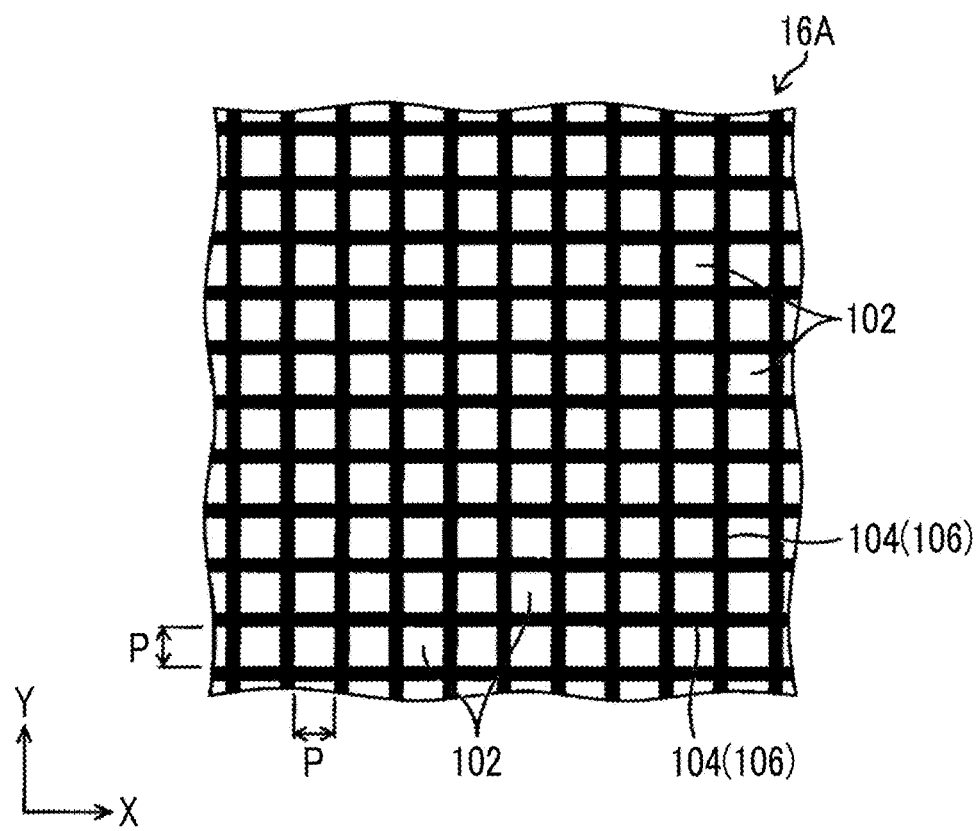
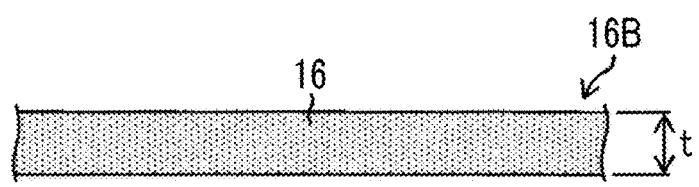

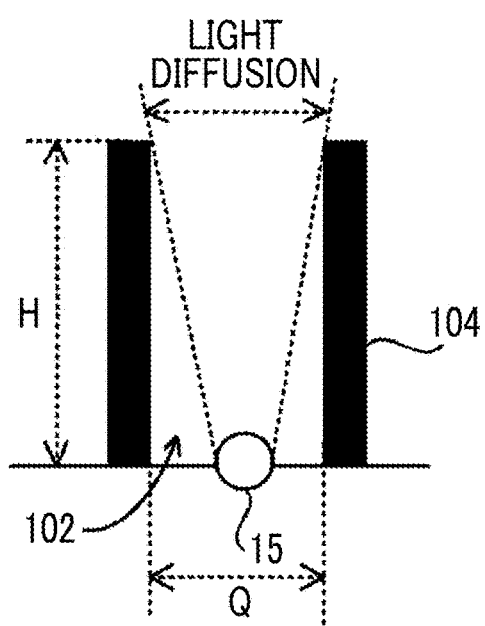
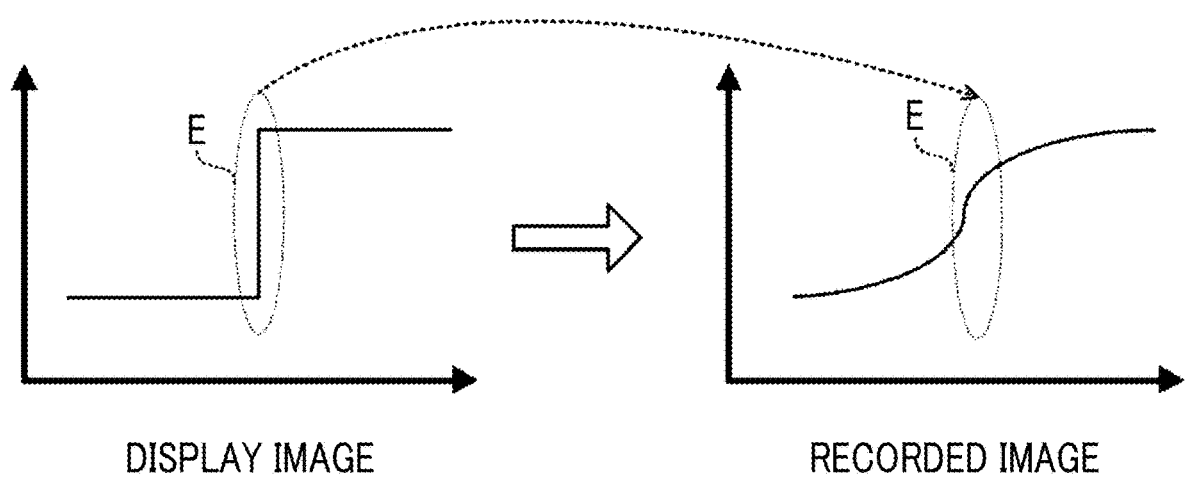

INPUT IMAGE         BLURRED IMAGE

HIGH-FREQUENCY
COMPONENT IMAGE

DISPLAY IMAGE

IMAGE EXPOSURE DEVICE, IMAGE EXPOSURE METHOD, AND PROGRAM

CROSS-REFERENCE TO RELATED APPLICATIONS

This application is a Continuation of PCT International Application No. PCT/JP2019/005531 filed on Feb. 15, 2019, which claims priority under 35 U.S.C § 119(a) to Japanese Patent Application No. 2018-069107 filed on Mar. 30, 2018. Each of the above applications is hereby expressly incorporated by reference, in its entirety, into the present application.

BACKGROUND OF THE INVENTION

1. Field of the Invention

The present disclosure relates to an image exposure device, an image exposure method, and a non-transitory computer readable medium for storing a program.

2. Description of the Related Art

For the exposure of photographs, photomasks, or the like, a projection optical system that is an optical system of a forming image system is being used. However, in a case of the projection optical system, an optical system such as a lens is required between a display image displayed by an image display device and a photosensitive material such as a photosensitive recording medium, and a large volume becomes necessary. In a case of exposing a pattern of a semiconductor or the like by using a photomask, the photomask is brought into close contact with or almost brought into close contact with the photosensitive material. At the time of exposure, a gap or a protective plate is provided between the photosensitive material and the mask pattern, and parallel light is projected, thereby suppressing blurring of the exposed image.

In addition, among light emitted from a light source, light emitted in parallel to the photosensitive material is used to irradiate and expose the photosensitive material, thereby suppressing blurring of an exposed recorded image. For example, JP2009-037011A and U.S. Pat. No. 9,126,396B disclose a technique in which the image display device such as an optical fiber array is installed between the photosensitive material and the display image displayed on an electronic display or the like, and in light radiated from the display toward the photosensitive material, parallel light from the display toward the photosensitive material is selected (collimated), and the photosensitive material is irradiated. The techniques disclosed in JP2009-037011A and U.S. Pat. No. 9,126,396B can suppress bleeding of the exposed recorded image.

SUMMARY OF THE INVENTION

As described above, in a case where light radiated from the image display device is collimated by limiting the light with a limiting member, light transmitted through the limiting member may be diffused depending on the structure of the limiting member. Therefore, the recorded image recorded on the photosensitive recording medium may be a so-called blurred image in which the density difference becomes small and the visibility of an edge portion of the image is reduced.

The techniques disclosed in JP2009-037011A and U.S. Pat. No. 9,126,396B may not be able to suppress the blurring of the recorded image caused by the diffusion of the light transmitted through the limiting member.

The present disclosure has been made in view of such circumstances, and an object of the present invention is to provide an image exposure device, an image exposure method, and a non-transitory computer readable medium for storing a program that can suppress the blurring of the recorded image as compared with a case where the limiting member is simply provided.

In order to achieve the above-described object, an image exposure device according to the first aspect of the present disclosure comprises an image display device that has a plurality of pixels and radiates light according to a display image represented by the plurality of pixels; a support portion that supports a photosensitive recording medium for recording a recorded image according to the display image in a state in which an exposure surface of the photosensitive recording medium faces the image display device; a limiting member that is provided between the image display device and the support portion, and limits an angle of the light radiated from the image display device to the photosensitive recording medium; and a controller that controls the image display device to display the display image in which an image quality of an input image represented by input image data is deteriorated by emphasizing a density difference of a high-frequency component of the input image.

In the image exposure device of the second aspect according to the first aspect of the present disclosure, the display image may be an image in which an edge is emphasized more than the recorded image.

In the image exposure device of the third aspect according to the first aspect or the second aspect of the present disclosure, the controller may emphasize the density difference of the high-frequency component by unsharp mask processing.

In the image exposure device of the fourth aspect according to the third aspect of the present disclosure, the controller may perform the unsharp mask processing weighted according to a resolution of the image display device.

In the image exposure device of the fifth aspect according to the third aspect or the fourth aspect of the present disclosure, in a case where weight of the unsharp mask processing is denoted by y and a standard deviation of a degree of a two-dimensional Gaussian distribution used for the unsharp mask processing is denoted by x, the following expression (1) may be satisfied.

$$-0.1 \times x + 0.40 < y < -0.1 \times x + 0.90 \quad (1)$$

In the image exposure device of the sixth aspect according to the third aspect or the fourth aspect of the present disclosure, in a case where weight of the unsharp mask processing is denoted by y, a standard deviation of a degree of a two-dimensional Gaussian distribution used for the unsharp mask processing is denoted by x, and a resolution of the image display device is denoted by X pixel per inch (ppi), the following expression (2) may be satisfied.

$$-0.1 \times x \times (X+325) + 0.40 < y < -0.1 \times x \times (X+325) + 0.90 \quad (2).$$

In the image exposure device of the seventh aspect according to any one aspect of the first aspect to the sixth aspect of the present disclosure, the limiting member may be an optical member of a diffusion optical system.

In the image exposure device of the eighth aspect according to the seventh aspect of the present disclosure, the optical member may be a louver film in which first light transmitting portions that transmit light and first light shielding portions that shield light are alternately disposed in a first direction on a surface parallel to a surface where the pixels of the image display device are arranged, and the second light transmitting portions that transmit light and second light shielding portions that shield light are alternately disposed in a second direction on the surface not parallel to the first direction.

In the image exposure device of the ninth aspect according to the seventh aspect of the present disclosure, the optical member may be a louver film in which first light transmitting portions that transmit light and first light shielding portions that shield light are alternately disposed in a first direction on a surface parallel to a surface where the pixels of the image display device are arranged, and second light transmitting portions that transmit light and the second light shielding portions that shield light are alternately disposed in a second direction on the surface perpendicular to the first direction.

In the image exposure device of the tenth aspect according to the eighth aspect or the ninth aspect of the present disclosure, the louver film may be formed by laminating the first layer in which the first light transmitting portions and the first light shielding portions are alternately disposed only in the first direction, and the second layer in which the second light transmitting portions and the second light shielding portions are alternately disposed only in the second direction.

In the image exposure device of the eleventh aspect according to any one aspect of the eighth aspect to the tenth aspect of the present disclosure, a thickness of the louver film may be 2.0 mm or more and 4.0 mm or less, and a louver pitch of the louver film may be 80 μm or less.

In the image exposure device of the twelfth aspect according to any one aspect of the first aspect to the eleventh aspect of the present disclosure, the limiting member may be disposed at a predetermined distance apart from the photosensitive recording medium.

In the image exposure device of the thirteenth aspect according to the twelfth aspect of the present disclosure, the predetermined distance may be 0.67 mm or less.

In order to achieve the above-described object, an image exposure method of the fourteenth aspect of the present disclosure is an image exposure method in an image exposure device including an image display device that has a plurality of pixels and radiates light according to a display image represented by the plurality of pixels, a support portion that supports a photosensitive recording medium for recording a recorded image according to the display image in a state in which an exposure surface of the photosensitive recording medium faces the image display device, and a limiting member that is provided between the image display device and the support portion, and limits an angle of the light radiated from the image display device to the photosensitive recording medium, and the method includes controlling the image display device to display the display image in which an image quality of an input image represented by input image data is deteriorated by emphasizing a density difference of a high-frequency component of the input image.

In order to achieve the above-described object, a non-transitory computer readable medium for storing a program of the fifteenth aspect of the present disclosure is a program for causing a computer to execute a process, the computer controlling an image exposure device including an image display device that has a plurality of pixels and radiates light according to a display image represented by the plurality of pixels, a support portion that supports a photosensitive recording medium for recording a recorded image according to the display image in a state in which an exposure surface of the photosensitive recording medium faces the image display device, and a limiting member that is provided between the image display device and the support portion, and limits an angle of the light radiated from the image display device to the photosensitive recording medium, and the process includes controlling the image display device to display the display image in which an image quality of an input image represented by input image data is deteriorated by emphasizing a density difference of a high-frequency component of the input image.

According to the present disclosure, the blurring of the recorded image can be suppressed as compared with a case where the limiting member is simply provided.

BRIEF DESCRIPTION OF THE DRAWINGS

FIG. 5 is a schematic cross-sectional view for explaining a traveling direction of light in the image exposure device of the embodiment.

FIG. 6 is a diagram showing a configuration of an example of a louver film of the present embodiment.

FIG. 8 is an explanatory diagram for explaining the diffusion of light transmitted through the louver film.

FIG. 9 is an explanatory diagram for explaining a difference between a display image and a recorded image.

DESCRIPTION OF THE PREFERRED EMBODIMENTS

Hereinafter, the image exposure device of the present embodiment will be described with reference to the drawings.

(Image Exposure Device)

Figure 1:
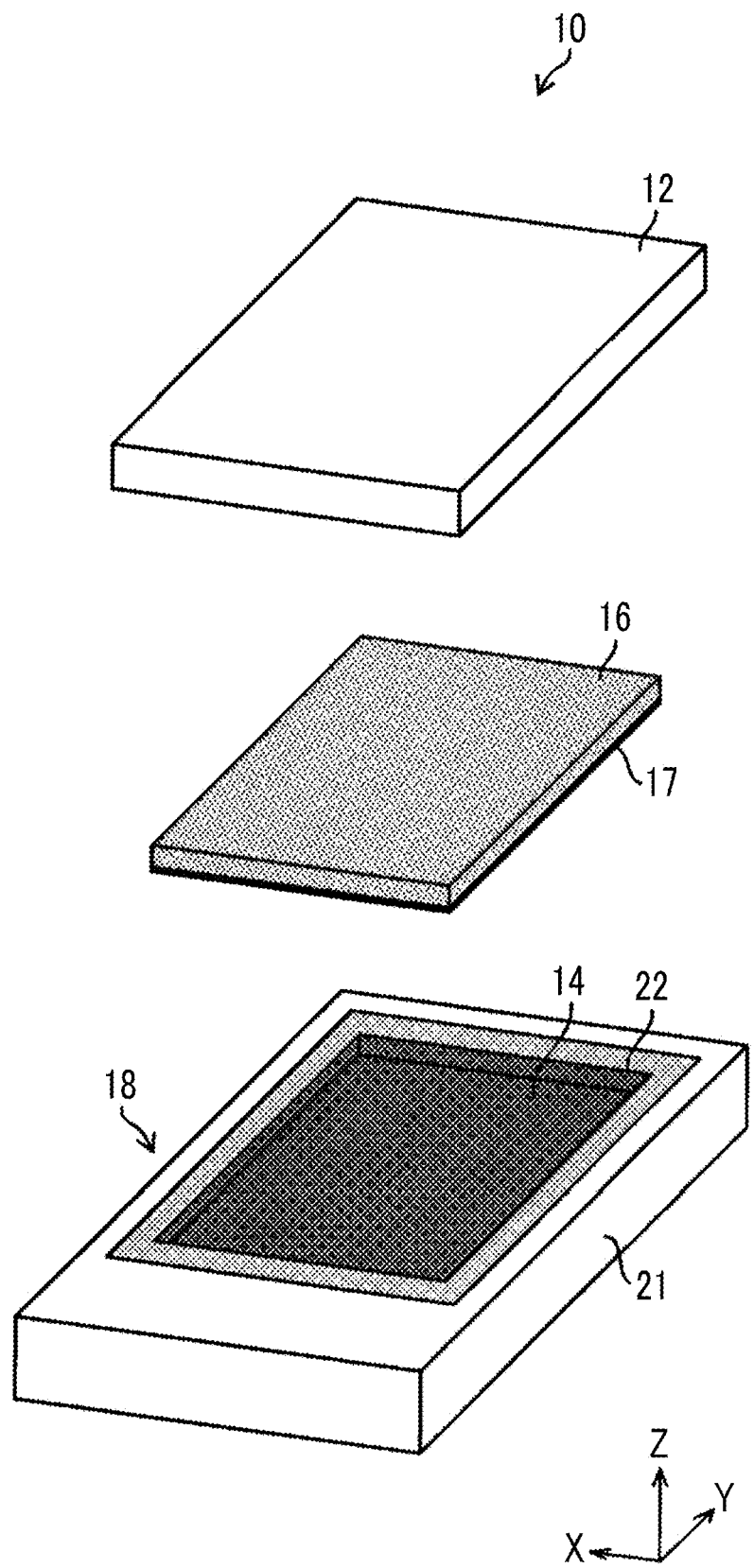
FIG. 1 is an exploded perspective view of an example of an image exposure device of an embodiment.

First, a configuration of the image exposure device of the present embodiment will be described. FIG. 1 shows an exploded perspective view of an example of the image exposure device of the present embodiment. In addition, FIG. 2 shows a cross-sectional view of an example of the image exposure device of the present embodiment.

Figure 2:
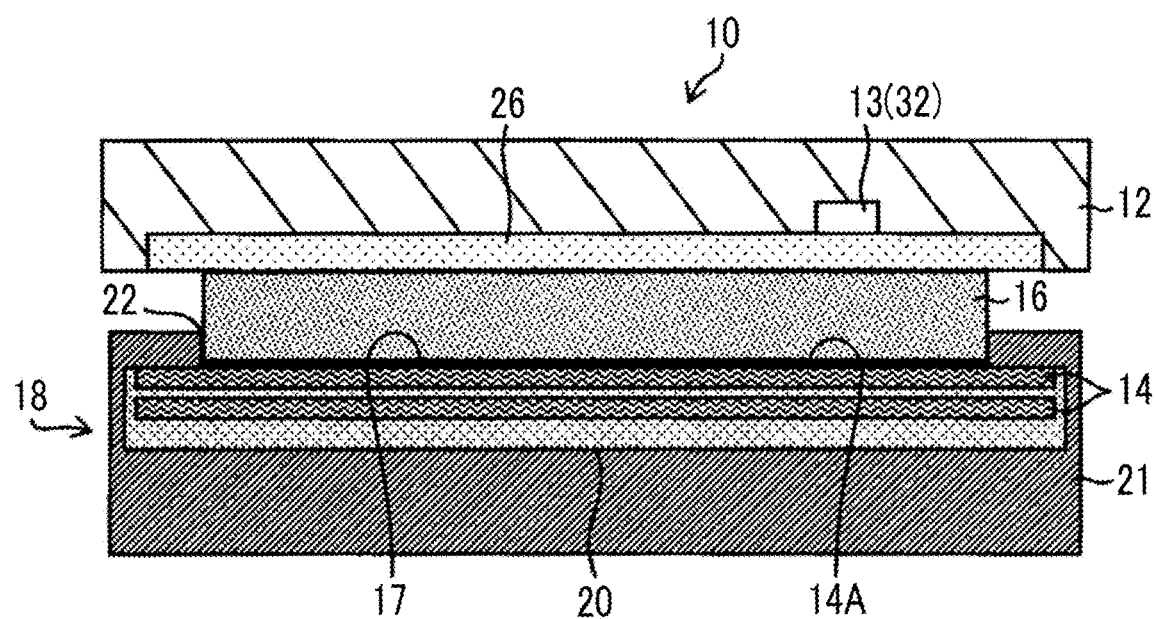
FIG. 2 is a cross-sectional view of an example of the image exposure device of the embodiment.

As shown in FIGS. 1 and 2, an image exposure device 10 of the present embodiment comprises an image display device 12, a support portion 21, and a louver film 16. The image display device 12 has a plurality of pixels 13. The support portion 21 supports a photosensitive recording medium 14 on which a recorded image corresponding to a display image displayed by the image display device 12 is recorded. The louver film 16 is provided between the image display device 12 and the support portion 21, and a protective layer 17 is provided on the support portion 21 side.

[Image Display Device]

As the image display device 12 of the present embodiment, it is possible to use a portable terminal such as a smartphone and a tablet PC, a liquid crystal display (LCD), a cathode ray tube (CRT), a light emitting diode (LED), a plasma display device, or the like.

The image display device 12 comprises a plurality of pixels 13 as a display portion 32 for displaying a display image. FIG. 2 shows one pixel 13 as an example of the display portion 32. The pixel 13 is a minimum unit of color information constituting an image display surface. The image display device 12 can display the display image by having the pixel 13. A pixel display surface of the image display device 12 has the pixels 13 two-dimensionally arranged. Two-dimensional means a state extending in X-Y directions in FIG. 1. By setting the distance (pitch) between the adjacent pixels to 13 to 200 µm or less, the impression of the recorded image as a natural image can be strengthened. Therefore, the pitch of the pixel 13 is preferably 150 µm or less, more preferably 125 µm or less, and even more preferably 85 µm or less.

A glass window 26 for protecting the pixel 13 is provided on a surface side irradiated with light from the image display device 12. The thickness of the glass window 26 is preferably thin in order to shorten the distance from the pixel 13 to the photosensitive recording medium 14.

Figure 3:
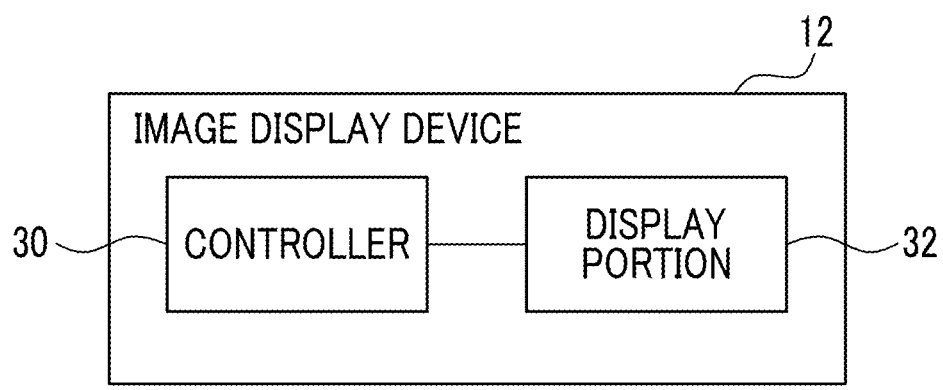
FIG. 3 is a block diagram representing an example of a functional configuration of the image display device of the embodiment.

In addition, FIG. 3 is a block diagram representing an example of a functional configuration of the image display device 12 of the present embodiment. The image display device 12 of the present embodiment comprises a controller 30 and the display portion 32.

The controller 30 causes the display portion 32 to display the input image represented by the input image data. Further, the controller 30 of the present embodiment controls the display portion 32 to display the display image in which an image quality of the input image is deteriorated by emphasizing a density difference of a high-frequency component of the input image.

The display portion 32 comprises the above-described pixel 13 and radiates light according to the display image represented by the pixel 13. For the display portion 32, for example, a liquid crystal in which a lamp such as a backlight radiates light may be applied, or for example, a light emitting diode in which the display portion 32 itself radiates light may be applied.

Figure 4:
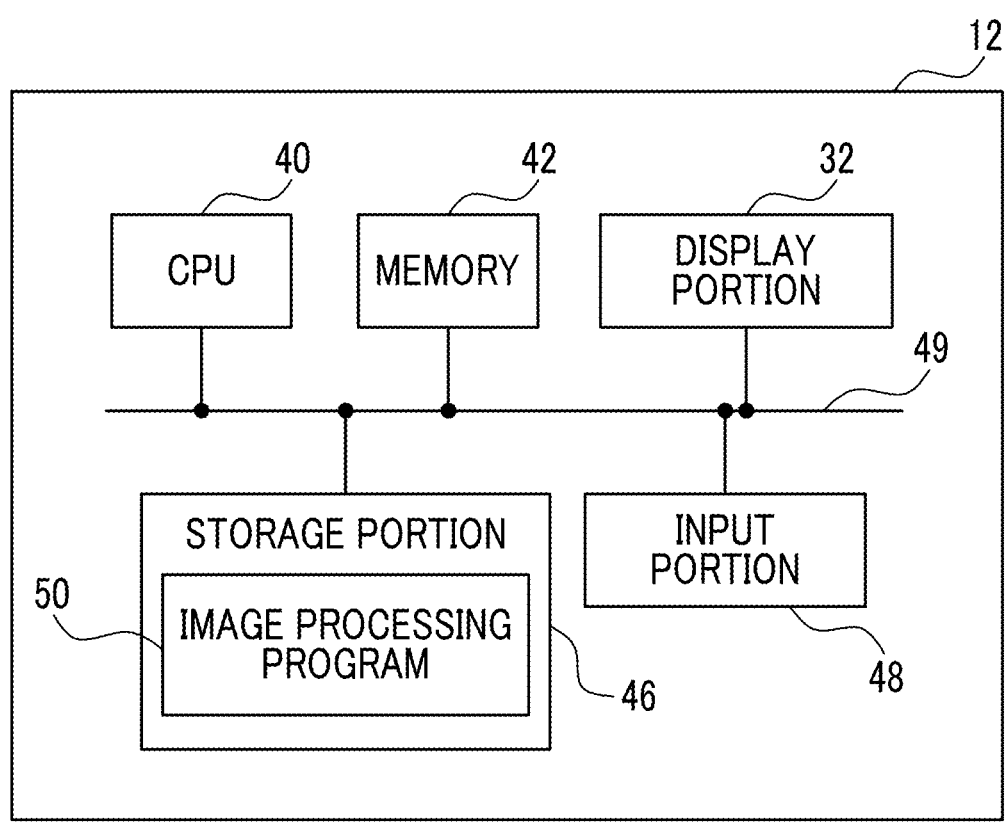
FIG. 4 is an explanatory diagram for explaining a hardware configuration of the image display device according to the present embodiment.

Next, a hardware configuration of the image display device 12 will be described with reference to FIG. 4. As shown in FIG. 4, the image display device 12 has a computer comprising a central processing unit (CPU) 40, a memory 42 as a temporary storage region, and a nonvolatile storage portion 46. In addition, the image display device 12 comprises the display portion 32 described above and an input portion 48. The CPU 40, the memory 42, the storage portion 46, the input portion 48, and the display portion 32 are connected via a bus 49.

The storage portion 46 is realized by a hard disk drive (HDD), a solid state drive (SSD), a flash memory, and the like. An image processing program 50 is stored in the storage portion 46 as a storage medium. The CPU 40 reads the image processing program 50 from the storage portion 46, expands the read image processing program 50 in the memory 42, and then executes the image processing program 50. In a case where the CPU 40 executes the image processing program 50, the CPU 40 functions as the controller 30 shown in FIG. 3.

Image data of the input image, in other words, image data corresponding to the display image displayed on the display portion 32 is input to the input portion 48. The image data of the input image may be input from the outside of the image display device 12 or the image exposure device 10, or, in a case where the image display device 12 or the image exposure device 10 itself has a function of forming or capturing an image, the image data formed or captured by the image display device 12 or the image exposure device 10 may be input.

[Support Portion]

The Support Portion 21 of the Present Embodiment Supports the Photosensitive recording medium 14 in a state of being disposed at a position facing the surface irradiated with light from the image display device 12. The support portion 21 may directly or indirectly support the photosensitive recording medium 14, and the structure thereof is not particularly limited as long as the support portion 21 is capable of supporting the photosensitive recording medium 14.

[Photosensitive Recording Medium]

As shown in FIG. 2, the photosensitive recording medium 14 of the present embodiment has an exposure surface 14A. The photosensitive recording medium 14 is not particularly limited as long as the photosensitive recording medium 14 can be exposed by light radiated from the image display device 12 and can form the recorded image. For example, it is possible to use a film pack 18 which is loaded into an instant camera (for example, manufactured by Fujifilm Corporation, Instax (registered trademark), (trade name: Cheki)).

The film pack 18 is formed by incorporating the photosensitive recording medium 14 into a case 20. A light-blocking sheet (not shown) is provided between a plurality of the photosensitive recording mediums 14 provided in the case 20 and only the photosensitive recording medium 14 present on the uppermost surface of the film pack 18 is exposed by the light-blocking sheet. In a case where the film pack 18 loaded into the Instax (registered trademark) is applied, the photosensitive recording medium 14 and the light-blocking sheet are incorporated in the film. As a material used for the photosensitive recording medium 14, for example, photographic photosensitive materials such as a negative film, a reversal film, printing paper, and a mono-sheet or peel-apart type instant photographic film can be exemplified.

As shown in FIG. 2, a plurality of the photosensitive recording medium 14 is packed in a box-like case 20 having a light-blocking property. In the case 20, an exposure opening 22 through which light radiated from the image display device 12 passes is provided in order to expose the exposure surface of the photosensitive recording medium 14. In addition, on a side opposite to the exposure opening 22, a pressing member (not shown) is provided, and the photosensitive recording medium 14 is pressed toward the exposure opening 22 side by using the pressing member. Therefore, the photosensitive recording medium 14 is pressed against the periphery of the exposure opening 22, the distance from the image display device 12 becomes close, and a favorable image can be recorded on the photosensitive recording medium 14.

As the case 20, it is possible to use a resin member for a recording material that is used for various recording materials such as a photographic light-sensitive material, a magnetic recording material, and an optical recording material. The resin member for the recording material refers to a case, a lid, and an accessory supplemented thereto which are used to contain, pack, coat, protect, transport, store the recording material, or support the form of the recording material or various members that mount the recording material and exhibit a function.

The photosensitive recording medium 14 after exposure is passed through between delivery rollers (not shown), whereby a pod portion provided in the photosensitive recording medium breaks. In the pod portion, a development process liquid is encapsulated, and the breakage of the pod portion causes the development process liquid to spread in the photosensitive recording medium 14. After one to several minutes elapses, a development process is sufficiently advanced, and a recorded image is formed on the photosensitive recording medium 14.

[Louver Film]

An example of the louver film 16 of the present embodiment will be described with reference to FIGS. 5 and 6. FIG. 5 is a schematic cross-sectional view of an example of the image exposure device 10 of the present embodiment, and is a diagram for explaining a traveling direction of light from the pixel 13. FIG. 6 is a diagram showing a configuration of an example of the louver film 16 of the present embodiment. A reference 16A denotes a planar surface 16A of the louver film 16, and a reference 16B denotes a side surface 16B of the louver film 16. In the louver film 16, light transmitting portions 102 that transmit light and light shielding portions 104 that shield light are alternately disposed in the first direction (X direction in the planar surface 16A in FIG. 6) on a surface parallel to a surface where the pixels 13 of the image display device 12 are arranged. The light transmitting portions 102 and the light shielding portions 104 disposed in the first direction of the present embodiment are examples of the first light transmitting portions and the first light shielding portions of the present disclosure.

In addition, in the louver film 16, the light transmitting portions 102 and the light shielding portions 104 are alternately disposed in the second direction (Y direction in the planar surface 16A in FIG. 6) perpendicular to the first direction on the surface parallel to the surface where the pixels of the image display device are arranged. The light transmitting portions 102 and the light shielding portions 104 disposed in the second direction of the present embodiment are examples of the second light transmitting portions and the second light shielding portions of the present disclosure.

As described above, in the present embodiment, the light transmitting portions 102 are two-dimensionally disposed, and the light shielding portions 104 are formed in a lattice form. With such a configuration, as shown in FIG. 5, an angle of light radiated from the pixel 13 of the image display device 12 to the exposure surface 14A of the photosensitive recording medium 14 is limited. The louver film 16 of the present embodiment is an example of a limiting member of the present disclosure.

The light radiated from the pixel 13 of the image display device 12 is radiated toward all directions within a range of 180° from an image display surface. The radiated light passes through the glass window 26 provided in the image display device 12 and is incident on the louver film 16. In the light incident on the louver film 16, light parallel to a straight line connecting the image display device 12 and the photosensitive recording medium 14 passes through the light transmitting portions 102 of the louver film 16. In addition, light radiated obliquely with respect to the straight line connecting the image display device 12 and the photosensitive recording medium 14 is blocked by the light shielding portions 104 in the louver film 16. By limiting the angle of the light radiated from the image display device 12, an image quality of the recorded image recorded on the photosensitive recording medium 14 is improved.

The light transmitting portions 102 only need to be able to pass through light, and can be provided using a glass material, a transparent silicone rubber, or the like. In addition, portions of the light transmitting portions 102 can be provided as cavities, and the louver film 16 can be composed of only the light shielding portions 104. The light shielding portions 104 may be a light absorbing member that absorbs light, or a light reflecting member that reflects light. A light shielding member 106 constituting the light shielding portions 104 can use a colored resin material such as a black silicone rubber. In addition, as the material that absorbs light, a neutral density filter (ND filter) can be used. The ND filter means a filter having a neutral optical density, and can evenly absorb light in a wavelength region used for exposure without giving an influence on the wavelength (absorbance of 50% or more to 99.999% or less; light transmittance of 0.001% or more to 50% or less).

Figure 7:
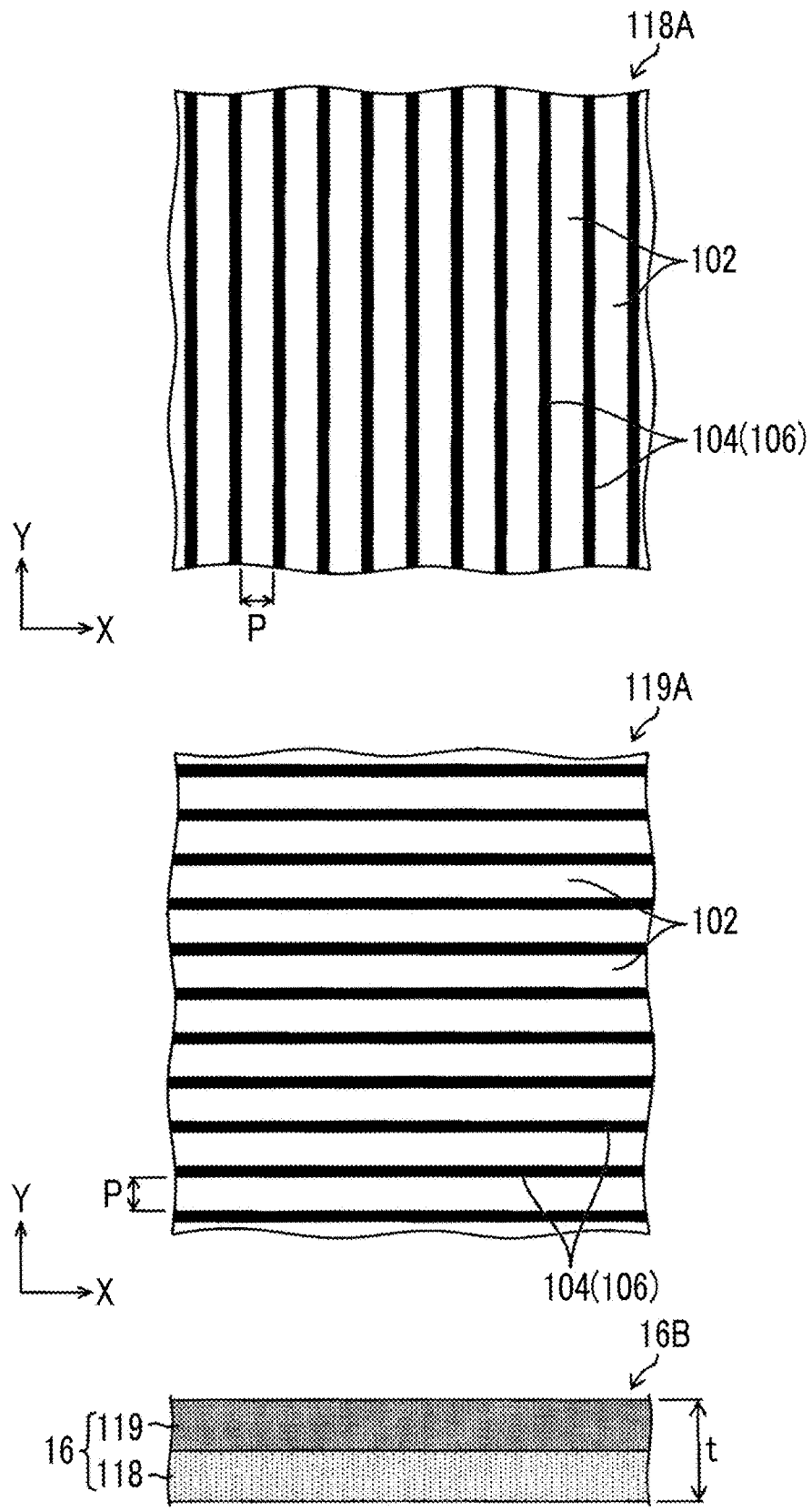
FIG. 7 is a diagram showing a configuration of another example of the louver film of the present embodiment.

The configuration of the louver film 16 is not limited to the present embodiment. FIG. 7 shows a configuration of another example of the louver film 16. The louver film 16 shown in FIG. 6 is formed of one layer as shown in the side surface 16B, and the light transmitting portions 102 and the light shielding portions 104 are alternately disposed in the one layer in the first direction and the second direction. Thus, the louver film 16 with a two-dimensional arrangement is formed.

On the other hand, the louver film 16 shown in FIG. 7 is composed of two layers of the first layer 118 and the second layer 119. A reference 16B denotes a side surface of the louver film 16, a reference 118A denotes a planar surface of the first layer 118, and a reference 119A denotes a planar surface of the second layer 119. As shown in the planar surface 118A of the first layer 118, the first layer 118 has light transmitting portions 102 and light shielding portions 104 alternately disposed only in the first direction (X direction in the planar surface 118A in FIG. 7). In the second layer 119, light transmitting portions 102 and light shielding portions 104 are alternately disposed only in the second direction perpendicular to the first direction (Y direction in the planar surface 119A in FIG. 7). The two-dimensional louver film 16 is formed by laminating the first layer 118 and the second layer 119. Thus, even in a case where the two-dimensional louver film 16 is formed with a plurality of layers, the same effect as that of the louver film 16 formed of one layer can be obtained.

A pitch P of the light shielding portions 104 (louvers) of the louver film 16 is preferably 80 μm or less, and more preferably 65 μm or less, as will be described later in a "louver pitch experiment". In a case where the pitch P of the light shielding portions 104 is set to be in the above-described range, it is possible to block obliquely radiated light in light radiated from the pixel 13, and to improve the image quality of the recorded image.

The light shielding portions 104 may be disposed with a difference in an angle between XY axes of the pixel as a reference for the arrangement of the pixel 13 and an angle between XY axes of the louver as the reference for the arrangement of the light transmitting portions 102 and the light shielding portions 104 of the louver film 16. That is, in a case where the first direction and the second direction are not parallel, they may not be vertical. Moire of the recorded image is suppressed by disposing the pixel 13 with the difference in the angle between the XY axes of the pixel 13 and the XY axes of the louver. The difference of the angle is preferably 1 degree to 45 degree, more preferably 5 degree to 40 degree, and even more preferably 10 degree to 35 degree.

The thickness t of the louver film 16, as described later as "louver film thickness experiment" is preferably 1.5 mm or more and 4.0 mm or less, more preferably 2.0 mm or more and 4.0 mm or less, and still more preferably 2.5 mm or more and 4.0 mm or less. By increasing the thickness t of the louver film 16, oblique light at a small angle with respect to parallel light can be blocked. In addition, in a case where the thickness t of the louver film 16 is increased, the recorded image is likely to be blurred and thus, the thickness t of the louver film 16 is preferably in the above-described range. The thickness t of the louver film 16 is the thickness of one layer in a case where it is formed of one layer as in the louver film 16 shown in FIG. 6, and the total thickness of a plurality of layers is the thickness of the louver film 16 in a case where it is formed of the plurality of layers such as two layers of the first layer and the second layer as in the louver film 16 shown in FIG. 7.

[Protective Layer]

The protective layer 17 is provided on the support portion 21 side of the louver film 16 as shown in FIGS. 1 to 2. The protective layer 17 protects the louver film 16 in a case where the photosensitive recording medium 14 and the louver film 16 are in contact with each other during exposure. The protective layer 17 prevents the louver film 16 from being damaged or broken by repeated exposure of the display image displayed on the image display device 12 to the photosensitive recording medium 14.

The protective layer 17 is not particularly limited as long as it is transparent and can transmit light. For the protective layer 17, for example, a plastic plate formed of an acrylic resin, a polycarbonate, a vinyl chloride resin, or the like can be used.

The thickness of the protective layer 17 is preferably 0.1 μm to 500 μm. In a case where the protective layer 17 has a thickness of 0.1 μm or more, it is possible to make moire inconspicuous in addition to the effect of protecting the louver film 16. In addition, it is possible to make an image defect formed on the basis of the defect or the structure of the louver film 16 inconspicuous. Further, in a case where the protective layer 17 has a thickness of 500 μm or less, the recorded image can be prevented from being blurred.

Next, an operation of the controller 30 of the image display device 12 of this embodiment will be described. As described above, the angle of the light radiated from the image display device 12 is limited by the louver film 16, and the light parallel to the straight line connecting the image display device 12 and the photosensitive recording medium 14 passes through the light transmitting portions 102 of the louver film 16. However, in actual fact, as shown in FIG. 8, light radiated from a point light source 15 of the display portion 32 is diffused. Specifically, according to the height H of the light shielding portions 104 and the width Q of the light and the light transmitting portion 102, a light component having a predetermined angle is transmitted, that is, diffused. Due to the diffused light component, as shown in FIG. 9, in the recorded image recorded on the photosensitive recording medium 14, a density difference of a high-frequency component (edge portion) E is reduced as compared with the display image. That is, in the recorded image, since the density difference is small, the edge portion tends to be difficult to be visually recognized, and as a result, there is a high concern that the recorded image may become a blurred image.

As the thickness t of the louver film 16 increases, the amount of light reaching the photosensitive recording medium 14 from the image display device 12 decreases, so that there is a problem in that the exposure time is extremely long. In addition, as in the example shown in FIG. 7, in a case where the louver film 16 is formed of a plurality of layers, light is diffused in the directions not shielded by the light shielding portions 104 in each layer, and thus, blurring of the recorded image is likely to occur. Further, as the thickness of the protective layer 17 increases, the distance from the exposure surface 14A of the photosensitive recording medium 14 increases, and the angle of light is not limited in the protective layer 17, and thus, blurring of the recorded image is likely to occur.

Therefore, in the present embodiment, the controller 30 of the image display device 12 performs image processing to increase (emphasis) the high-frequency component (edge portion) of the display image in advance in consideration of the fact that the density difference is reduced in the recorded image rather than in the display image.

Figure 10:
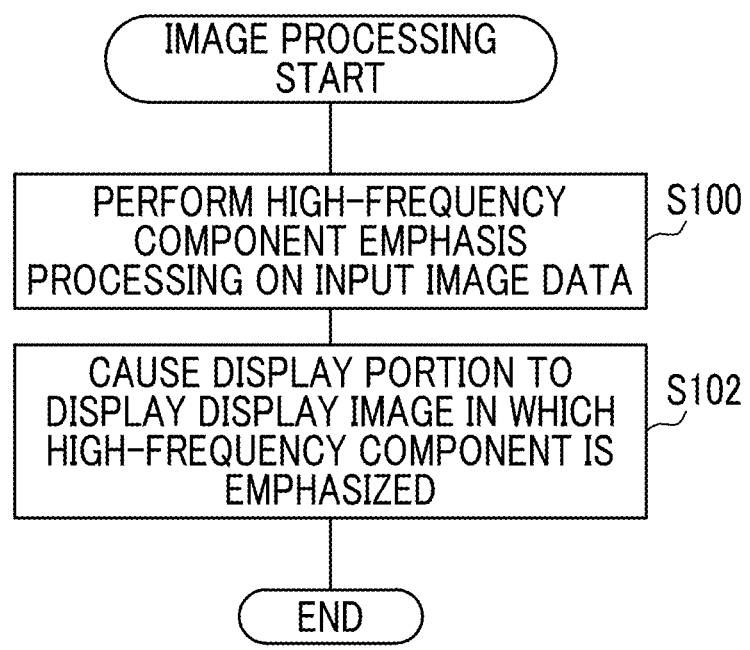
FIG. 10 is a flowchart of an example of image processing executed by a controller of the image display device of the present embodiment.

FIG. 10 shows a flowchart of an example of image processing executed by the controller 30 of the present embodiment. The image processing shown in FIG. 10 is executed in a case where the CPU 40 executes the image processing program 50.

In step S100 shown in FIG. 10, the controller 30 performs high-frequency component emphasis processing on the input image data to emphasize the density difference of the high-frequency component of the input image. In the present embodiment, the controller 30 performs unsharp mask processing as an example of the high-frequency component emphasis processing.

Specifically, first, an unsharp mask is generated. For the generation of the unsharp mask, for example, a two-dimensional Gaussian distribution is applied, in which f(x, y) is a filter coefficient and the degree of distribution is a standard deviation σ, as shown in the following expression (1).

$$f(x, y) = \frac{1}{2\pi\sigma^2} e^{-\frac{x^2+y^2}{2\sigma^2}} \tag{1}$$

The standard deviation σ in the above expression (1) is a Gaussian distribution, that is, the radius of blurring of a blurred image, and is denoted by the number of pixels in the present embodiment.

Figure 11A:
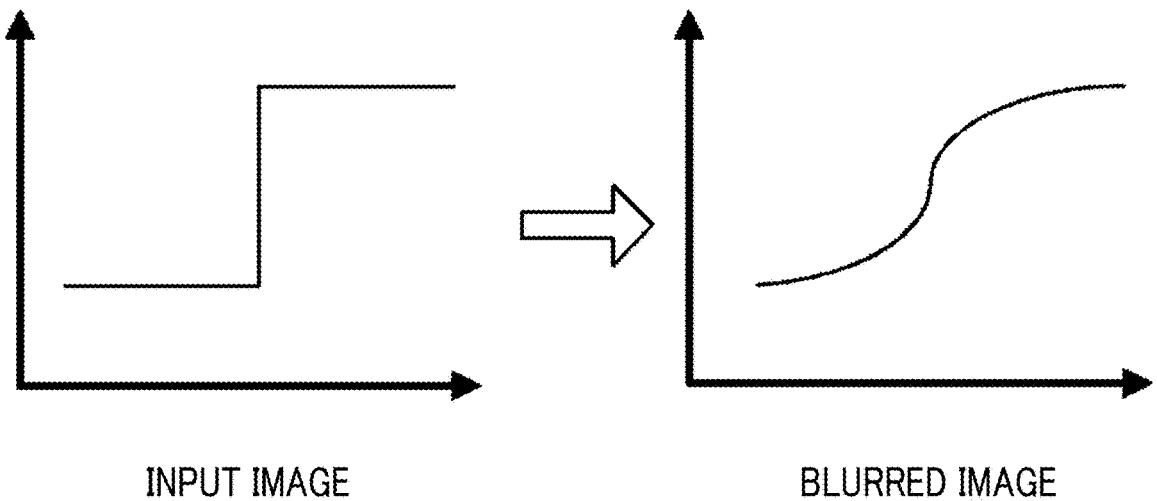
FIG. 11A is an explanatory diagram for explaining an example of high-frequency component emphasis processing in the image processing shown in FIG. 10.

By multiplying the input image by the unsharp mask shown in the expression (1), the blurred image is generated from the input image as shown in FIG. 11A.

Figure 11B:
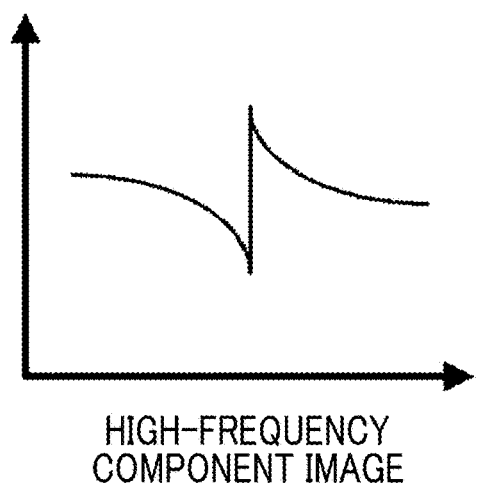
FIG. 11B is an explanatory diagram continued from FIG. 11A for explaining an example of the high-frequency component emphasis processing in the image processing shown in FIG. 10.

Further, as shown in FIG. 11B, the controller 30 generates a high-frequency component image from a difference between the input image and the blurred image. As shown in FIG. 11B, in the high-frequency component image, the difference becomes particularly large in the region where a gradation difference is large.

Figure 11C:
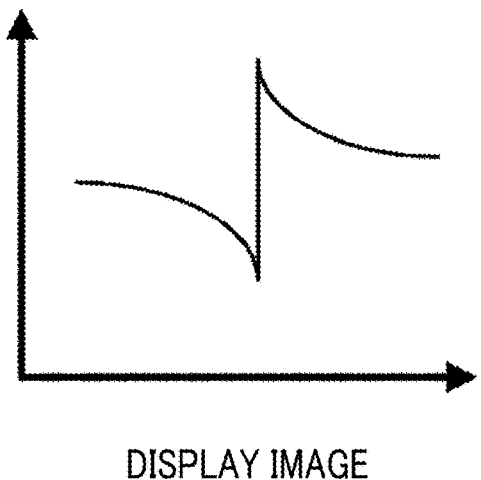
FIG. 11C is an explanatory diagram continued from FIG. 11B for explaining an example of the high-frequency component emphasis processing in the image processing shown in FIG. 10.

Furthermore, as shown in FIG. 11C, the controller 30 adds the high-frequency component image to the input image according to weight W to generate a display image in which the high-frequency component is emphasized. That is, the display image is in a state in which the image quality is deteriorated as compared with the input image.

Figure 12:
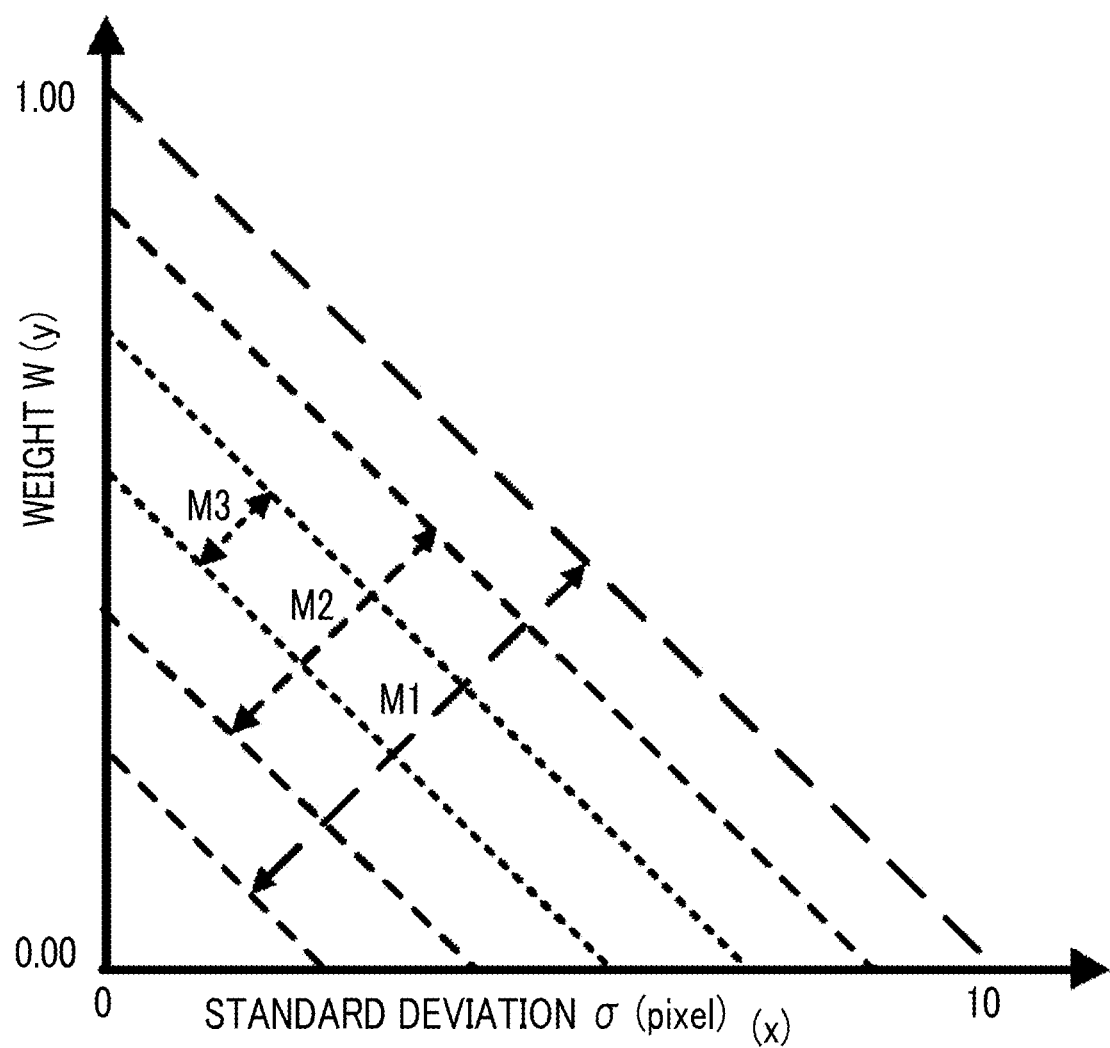
FIG. 12 is a graph for explaining a preferable range of unsharp mask processing executed by the controller of the image display device of the embodiment.

In a case where the resolution of the image display device 12 is 325 ppi (pixel per inch), in the unsharp mask processing to be applied to the input image, the range of the unsharp mask to be applied is preferably a range M1 represented by the following expression (2), more preferably a range M2 represented by the following expression (3), and still more preferably a range M3 represented by the following expression (4), as described later as the "high-frequency component emphasis experiment" in a case where the standard deviation σ is denoted by x and the weight W is denoted by y, as shown in FIG. 12.

$$-0.1 \times x + 0.30 < y < -0.1 \times x + 1.00 \qquad (2)$$

$$-0.1 \times x + 0.40 < y < -0.1 \times x + 0.90 \qquad (3)$$

$$-0.1 \times x + 0.50 < y < -0.1 \times x + 0.80 \qquad (4)$$

In a case where the resolution of the image display device 12 is X ppi, an unsharp mask corresponding to a range obtained by multiplying the standard deviation σ of the above expressions (2) to (4) by the number obtained by dividing X by 325 may be applied. Specifically, an unsharp mask corresponding to the ranges M1 to M3 represented by each of the following expressions (5) to (7) may be applied.

$$-0.1 \times x \times (X \div 325) + 0.30 < y < -0.1 \times x \times (X \div 325) + 1.00 \qquad (5)$$

$$-0.1 \times x \times (X \div 325) + 0.40 < y < -0.1 \times x \times (X \div 325) + 0.90 \qquad (6)$$

$$-0.1 \times x \times (X \div 325) + 0.50 < y < -0.1 \times x \times (X \div 325) + 0.80 \qquad (7)$$

After the high-frequency component emphasis processing is performed in this way, in the next step S102, the controller 30 causes the display portion 32 to display the display image in which the high-frequency component is emphasized, and ends the main image processing.

[Effect Experiment of Image Exposure Device]

Next, an experimental result performed on the effect of the image exposure device 10 of the present embodiment will be shown.

(Basic Experiment)

In the experiment, as the image display device 12, an IGZO 20.066 cm (7.9 inch) display having a resolution of 325 ppi is used. In addition, the support portion 21 is a metal plate, and the photosensitive recording medium 14 is an Instax film. Further, as the louver film 16, the louver film in which the first layer 118, in which light transmitting portions 102 having a thickness of 45 μm and light shielding portions 104 having a thickness of 15 μm are alternately disposed only in the first direction, and the second layer 119, in which light transmitting portions 102 having a thickness of 45 μm and light shielding portions 104 having a thickness of 15 μm are alternately disposed only in the second direction perpendicular to the first direction, are laminated is used. The thickness of each layer of the louver film 16 is set to 1.5 mm. In addition, the thickness of the protective layer 17 on each surface is set to 0.2 μm, and the louver film 16 is rotated by 30 deg with respect to a pixel disposition (XY axes) of the display portion 32.

As the display image, a general photographic image in which a landscape or a person is a subject, and an evaluation image in which a contrast transfer function (CTF) for determining the resolution is 60% are used. In addition, an image in which the high-frequency component is not emphasized (the edge portion is emphasized) is used as a comparison image for the recorded image of the present embodiment. In other words, the recorded image in a case where the image that has not been subjected to the image processing by the controller 30 is used as the input image is used as the comparison image. Hereinafter, a recorded image to which a high-frequency emphasized image of the present embodiment is applied may be referred to as an "emphasized image" in order to distinguish the recorded image from the comparison image.

In the high-frequency component emphasis (edge emphasis) processing, the standard deviation σ is set to 2 pixels, the weight W is set to 0.5, and the unsharp mask processing using the two-dimensional Gaussian distribution shown in (1) described above is performed.

An evaluation method of an image quality is a sensory evaluation by an evaluation expert who has evaluated a sense of resolution of the photograph as to whether or not blurred feeling of the emphasized image is reduced with respect to the comparison image, and whether or not the image has good visibility and is preferable.

As an evaluation result, a result that the visibility of the emphasized image is good is obtained for both the general photographic image and the CTF evaluation image.

Figure 13:
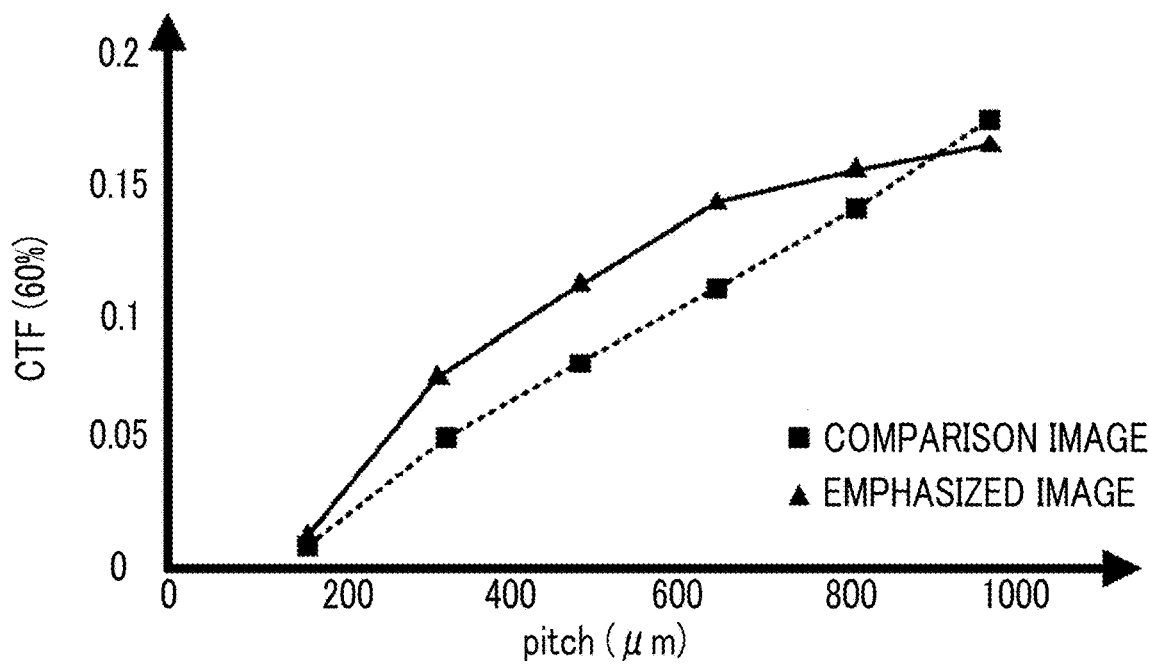
FIG. 13 is a graph showing an experimental result of a basic experiment.

In addition, FIG. 13 shows a relationship between a pitch of the image (a pitch of black and white) and CTF for the comparison image and the emphasized image using the CTF evaluation image as the input image. As shown in FIG. 13, it can be seen that the contrast of the high-frequency component is increased in the emphasized image compared to the comparison image.

(Louver Pitch Experiment)

In the experiment, as the image display device 12, an IGZO 20.066 cm (7.9 inch) display having a resolution of 325 ppi is used. In addition, the support portion 21 is a metal plate, and the photosensitive recording medium 14 is an Instax film. Further, as the louver film 16, one of two types having different louver pitches P and satisfying the following conditions A and B is used.

A: The first layer 118, in which light transmitting portions 102 having a thickness of 60 μm and light shielding portions 104 having a thickness of 15 μm are alternately disposed only in the first direction, and the second layer 119, in which light transmitting portions 102 having a thickness of 60 μm and light shielding portions 104 having a thickness of 15 μm are alternately disposed only in the second direction perpendicular to the first direction are laminated. In addition, the thickness of each layer is 2.0 mm, the thickness of the protective layer 17 on each surface is 0.2 μm, which is rotated by 45 deg with respect to the pixel disposition (XY axes) of the display portion 32.

B: The first layer 118, in which light transmitting portions 102 having a thickness of 45 μm and light shielding portions 104 having a thickness of 15 μm are alternately disposed only in the first direction, and the second layer 119, in which light transmitting portions 102 having a thickness of 45 μm and light shielding portions 104 having a thickness of 15 μm are alternately disposed only in the second direction perpendicular to the first direction are laminated. In addition, the thickness of each layer is 2.0 mm, the thickness of the protective layer 17 on each surface is 2.0 mm (thickness t=4.0 mm), which is rotated by 30 deg with respect to the pixel disposition (XY axes) of the display portion 32.

Further, for comparison with a case where the louver film 16 under the conditions of "A" or "B" is applied, an aspect in which the louver film 16 is not applied will be described below as "C".

As the display image, a general photographic image in which a landscape or a person is a subject is used. In addition, an image in which the high-frequency component is not emphasized (the edge portion is emphasized) is used as a comparison image.

In the high-frequency component emphasis (edge emphasis) processing, the standard deviation σ is set to 2 pixels, the weight W is set to 0.5, and the unsharp mask processing using the two-dimensional Gaussian distribution shown in (1) described above is performed.

An evaluation method of an image quality is a sensory evaluation by an evaluation expert who has evaluated a sense of resolution of the photograph as to whether or not blurred feeling of the emphasized image is reduced with respect to the comparison image, and whether or not the image has good visibility and is preferable.

The evaluation results are shown in Table 1 below. In Table 1, the image quality is evaluated in four stages from I to IV "I" has the best visibility, "II" represents that the visibility is good, "III" represents that the blurring of the image is improved, and "IV" represents that the visibility is poor, in other words, it represents that the image is blurred.

transmitting portions 102 having a thickness of 45 μm and light shielding portions 104 having a thickness of 15 μm are alternately disposed only in the second direction perpendicular to the first direction, are laminated is used. In addition, the louver film 16 is rotated by 30 deg with respect to the pixel disposition (XY axes) of the display portion 32.

Six types of louver film 16 are prepared in which the conditions of the thickness (thickness t) of each layer are varied. In condition B, the thickness of each layer is set to 2.0 mm (thickness t=4.0 mm), in condition D, the thickness of each layer is set to 1.5 mm (thickness t=3.0 mm), in condition E, the thickness of each layer is set to 1.5 mm (thickness t=3.0 mm), in condition F, the thickness of each layer is set to 1.25 mm (thickness t=2.50 mm), in condition G, the thickness of each layer is set to 1.0 mm (thickness t=2.0 mm), and in condition H, the thickness of each layer is set to 0.75 mm (thickness t=1.5 mm). The thickness of the protective layer 17 on each surface under the conditions B and D is set to 0.2 μm, and the thickness of the protective layer 17 on each surface under the conditions E, F, G, H is set to 0.1 μm. Further, for comparison, the aspect in which the louver film 16 is not applied will be described below as "C".

As the display image, a general photographic image in which a landscape or a person is a subject is used. In

TABLE 1

| | First layer | | | Second layer | | | | |
| --- | --- | --- | --- | --- | --- | --- | --- | --- |
| | Pitch (μm) | Transmission width (μm) | Light-blocking width (μm) | Pitch (μm) | Transmission width (μm) | Light-blocking width (μm) | Thickness (mm) | Image quality |
| A | 75 | 60 | 15 | 75 | 60 | 15 | 4.0 | II |
| B | 60 | 45 | 15 | 60 | 45 | 15 | 4.0 | I |
| C | — | — | — | — | — | — | — | IV |

As shown in Table 1 above described, it can be seen that in a case where the louver film 16 under the condition A is applied, the visibility of the emphasized image is good, and in a case where the louver film 16 under the condition B is applied, the visibility of the emphasized image is the highest. In addition, it can be seen that the image is blurred under the above condition C, that is, in a case where the louver film 16 is not applied.

Therefore, according to the present experiment, as described above, the louver pitch P is preferably 80 μm or less, and more preferably 65 μm or less.

(Louver Film Thickness Experiment)

In the experiment, as the image display device 12, an IGZO 20.066 cm (7.9 inch) display having a resolution of 325 ppi is used. In addition, the support portion 21 is a metal plate, and the photosensitive recording medium 14 is an Instax film.

Further, as the louver film 16, the louver film 16 in which the first layer 118, in which light transmitting portions 102 having a thickness of 45 μm and light shielding portions 104 having a thickness of 15 μm are alternately disposed only in the first direction, and the second layer 119, in which light addition, an image in which the high-frequency component is not emphasized (the edge portion is emphasized) is used as a comparison image for the recorded image of the present embodiment.

In the high-frequency component emphasis (edge emphasis) processing, the standard deviation σ is set to 2 pixels, the weight W is set to 0.5, and the unsharp mask processing using the two-dimensional Gaussian distribution shown in (1) described above is performed.

An evaluation method of an image quality is a sensory evaluation by an evaluation expert who has evaluated a sense of resolution of the photograph as to whether or not blurred feeling of the emphasized image is reduced with respect to the comparison image, and whether or not the image has good visibility and is preferable.

The evaluation results are shown in Table 2 below. In Table 1, the image quality is evaluated in four stages from I to IV "I" has the best visibility, "II" represents that the visibility is good, "III" represents that the blurring of the image is improved, and "IV" represents that the visibility is poor, in other words, it represents that the image is blurred.

TABLE 2

| | First layer | | | Second layer | | | | |
|---|---|---|---|---|---|---|---|---|
| | Pitch (μm) | Transmission width (μm) | Light-blocking width (μm) | Pitch (μm) | Transmission width (μm) | Light-blocking width (μm) | Thickness (mm) | Image quality |
| B | 60 | 45 | 15 | 60 | 45 | 15 | 4.0 | I |
| C | — | — | — | — | — | — | — | IV |
| D | 60 | 45 | 15 | 60 | 45 | 15 | 3.0 | I |
| E | 60 | 45 | 15 | 60 | 45 | 15 | 3.0 | I |
| F | 60 | 45 | 15 | 60 | 45 | 15 | 2.5 | I |
| G | 60 | 45 | 15 | 60 | 45 | 15 | 2.0 | I |
| H | 60 | 45 | 15 | 60 | 45 | 15 | 1.5 | II |

Therefore, as shown in Table 2 and as described above, the thickness t of the louver film 16 is preferably 1.0 mm or more and 4.0 mm or less, more preferably 1.5 mm or more and 4.0 mm or less, and still more preferably 2.0 mm or more and 4.0 mm or less.

(High-Frequency Component Emphasis Experiment)

In the experiment, as the image display device 12, an IGZO 20.066 cm (7.9 inch) display having a resolution of 325 ppi is used. In addition, the support portion 21 is a metal plate, and the photosensitive recording medium 14 is an Instax film. Further, as the louver film 16, the louver film in which the first layer 118, in which light transmitting portions 102 having a thickness of 45 μm and light shielding portions 104 having a thickness of 15 μm are alternately disposed only in the first direction, and the second layer 119, in which light transmitting portions 102 having a thickness of 45 μm and light shielding portions 104 having a thickness of 15 μm are alternately disposed only in the second direction perpendicular to the first direction, are laminated is used. The thickness of each layer of the louver film 16 is set to 1.5 mm (thickness t=3.0 mm). In addition, the thickness of the protective layer 17 on each surface is set to 0.2 and the louver film 16 is rotated by 30 deg with respect to a pixel disposition (XY axes) of the display portion 32.

As the display image, a general photographic image in which a landscape or a person is a subject is used. In addition, an image in which the high-frequency component is not emphasized (the edge portion is emphasized) is used as a comparison image for the recorded image of the present embodiment.

Figure 14:
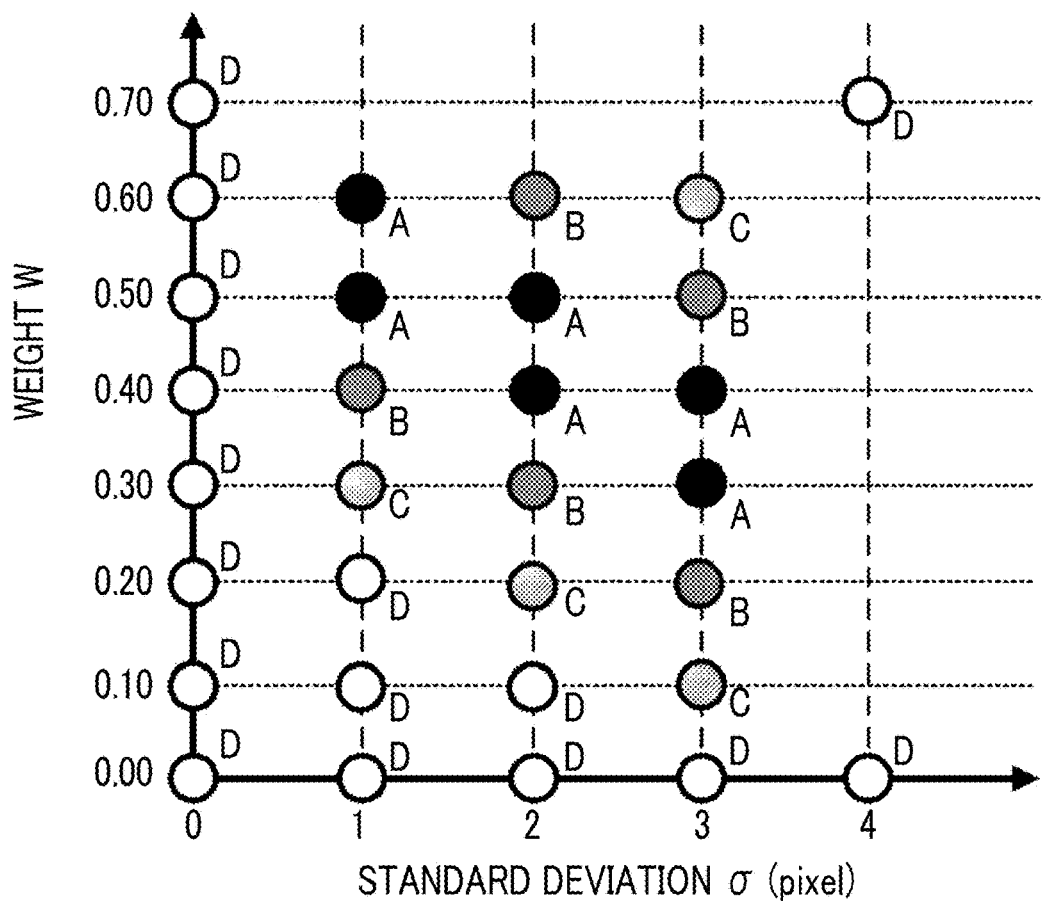
FIG. 14 is a graph showing an experimental result of a high-frequency component emphasis experiment.

Further, in the high-frequency component emphasis (edge emphasis) processing, the unsharp mask processing using the two-dimensional Gaussian distribution shown in (1) described above is performed by making the standard deviation σ and the weight W different as shown in FIG. 14.

An evaluation method of an image quality is a sensory evaluation by an evaluation expert who has evaluated a sense of resolution of the photograph as to whether or not blurred feeling of the emphasized image is reduced with respect to the comparison image, and whether or not the image has good visibility and is preferable.

FIG. 14 shows the evaluation result. In FIG. 14, the image quality is evaluated in four stages. In FIG. 14, "A" has the best visibility, "B" represents that the visibility is good, "C" represents that the blurring of the image is improved, and "D" represents that the visibility is poor, in other words, it represents that the image is blurred.

Therefore, as shown in FIG. 14 and as described above, the range of the unsharp mask is preferably the range M1 represented by the above-described expression (2) where the standard deviation σ is denoted by x and the weight W is denoted by y, the range M2 represented by the above-described expression (3) is more preferable, and the range M3 represented by the above-described expression (4) is more preferable.

Regarding the thickness of the louver film 16, in a case where an experiment is performed in the same manner as described above with each layer having a thickness of 1.25 mm (thickness t=2.5 mm), 1.00 mm (thickness t=2.0 mm), and 0.75 mm (thickness t=1.5 mm), similar results are obtained. In other words, in a case where the thickness of each layer of the louver film 16 is 1.5 mm, 1.25 mm, 1.00 mm, and 0.75 mm, the range of the unsharp mask is preferably the range M1 represented by the above-described expression (2) where the standard deviation σ is denoted by x and the weight W is denoted by y, the range M2 represented by the above-described expression (3) is more preferable, and the range M3 represented by the above-described expression (4) is more preferable.

(Distance Experiment Between Display Image and Exposure Surface)

In the experiment, as the image display device 12, an IGZO 20.066 cm (7.9 inch) display having a resolution of 325 ppi is used. In addition, the support portion 21 is a metal plate, and the photosensitive recording medium 14 is an Instax film. Further, as the louver film 16, the louver film in which the first layer 118, in which light transmitting portions 102 having a thickness of 45 μm and light shielding portions 104 having a thickness of 15 μm are alternately disposed only in the first direction, and the second layer 119, in which light transmitting portions 102 having a thickness of 45 μm and light shielding portions 104 having a thickness of 15 μm are alternately disposed only in the second direction perpendicular to the first direction, are laminated is used. The thickness of each layer of the louver film 16 is set to 1.5 mm. In addition, the thickness of the protective layer 17 on each surface is set to 0.2 μm, and the louver film 16 is rotated by 30 deg with respect to a pixel disposition (XY axes) of the display portion 32.

Further, in the present experiment, glass substrates (D263 Teco thin plate glass/made by SCHOTT) having different thicknesses of 0.5 mm, 1.0 mm, and 1.5 mm are provided between the louver film 16 and the exposure surface 14A of the photosensitive recording medium 14, and the experiment is performed. Since a refractive index n is 1.5, the thickness in the atmosphere is a value obtained by dividing the thickness of the above-described glass substrates by 1.5.

As the display image, a general photographic image in which a landscape or a person is a subject is used. In addition, an image in which the high-frequency component is not emphasized (the edge portion is emphasized) is used as a comparison image for the recorded image of the present embodiment.

In the high-frequency component emphasis (edge emphasis) processing, the standard deviation σ is set to 2 pixels, the weight W is set to 0.5, and the unsharp mask processing using the two-dimensional Gaussian distribution shown in (1) described above is performed.

An evaluation method of an image quality is a sensory evaluation by an evaluation expert who has evaluated a sense of resolution of the photograph as to whether or not blurred feeling of the emphasized image is reduced with respect to the comparison image, and whether or not the image has good visibility and is preferable.

As a result of the evaluation, the visibility of the emphasized image is particularly excellent in a case where the thickness of the glass substrates is 0.5 mm and in a case where the thickness of the glass substrates is 1.0 mm. In addition, in a case where the thickness of the glass substrates is 1.5 mm, the visibility of the emphasized image is better than that of the comparison image, although it is inferior to the above case.

In other words, in a case where the distance between the louver film 16 and the exposure surface 14A is 0.5 mm and 1.0 mm, the visibility of the emphasized image is particularly excellent, and even in a case where the distance between the louver film 16 and the exposure surface 14A is 1.5 mm, the visibility of the emphasized image is excellent.

Therefore, according to the present experiment, it can be seen that the surface (16A) of the louver film 16 and the exposure surface 14A of the photosensitive recording medium 14 may be exposed at a predetermined distance. In addition, it can be seen that the thickness of the glass substrate having a refractive index n of 1.5 for the predetermined distance is preferably 1.50 mm or less, more preferably 1.00 mm or less, and even more preferably 0.50 mm or less. In a case where the above is converted into the thickness in the atmosphere having a refractive index n of 1.0, it can be seen that the thickness is preferably 1.00 mm or less, more preferably 0.67 mm or less, and even more preferably 0.33 mm or less.

As described above, the image exposure device 10 according to the present embodiment comprises an image display device 12 that has a plurality of pixels 13 and radiates light according to a display image represented by the plurality of pixels 13; a support portion 21 that supports a photosensitive recording medium 14 for recording a recorded image according to the display image in a state in which an exposure surface 14A of the photosensitive recording medium 14 faces the image display device 12; a louver film 16 that is provided between the image display device 12 and the support portion 21, and limits an angle of the light radiated from the image display device 12 to the photosensitive recording medium 14; and a controller 30 that controls the image display device 12 to display the display image in which an image quality of an input image represented by input image data is deteriorated by emphasizing a density difference of a high-frequency component of the input image.

As described above, the controller 30 of the image display device 12 in the image exposure device 10 of the present embodiment controls the display portion 32 to display the display image in which the image quality of the input image is deteriorated by emphasizing a density difference of the high-frequency component of the input image. The recorded image recorded on the photosensitive recording medium 14 becomes a blurred image than the display image due to the diffusion of the light transmitted through the louver film 16, but the image has the same image quality as the input image. That is, according to the image exposure device 10 of the present embodiment, even in a case where the image quality of the display image is deteriorated, the image quality of the recorded image is the same as the image quality of the input image.

Therefore, according to the image exposure device 10 of the present embodiment, it is possible to suppress the blurring of the recorded image and improve the image quality as compared with a case where the louver film 16 is simply provided.

In the present embodiment, the aspect in which the unsharp mask processing is performed as the high-frequency component emphasis processing performed by the controller 30 has been described, but the present invention is not limited to this embodiment, and for example, convolution processing or the like may be applied.

In addition, for example, the structure of the louver film 16 is not limited, and further, it is not limited as long as it is a limiting member capable of limiting the angle of the light radiated from the image display device 12. For example, the light transmitting portions 102 and the light shielding portions 104 may be disposed aperiodically, and a capillary plate or the like in which holes are randomly formed may be used as the limiting member.

In addition, in the present embodiment, the aspect in which the protective layer 17 is provided on the support portion 21 side of the louver film 16 has been described, but a position at which the protective layer 17 is provided is not limited to this embodiment, and for example, and may be provided on both the support portion 21 side of the louver film 16 and the image display device 12 side. In other words, the protective layer 17 may be provided on both sides of the louver film 16 through which light passes. In a case where the protective layer 17 is provided on both sides of the louver film 16, it is possible to make the image defect formed on the basis of the defect or the structure of the louver film 16 inconspicuous.

In addition, in the present embodiment, the aspect in which the image display device 12 comprises the controller 30 has been described, but the controller 30 may be configured as a device different from the image display device 12. For example, a CPU such as a smartphone may execute the image processing program 50 to perform image processing by functioning as the controller 30, and the image display device 12 may receive the image data subjected to the image processing from the smartphone and display a display image corresponding to the image data on the display portion 32.

Further, the image processing executed by the CPU executing the software (program) in each of the above-described embodiments may be executed by various processors other than the CPU. Examples of the processor in this case include a programmable logic device (PLD) whose circuit configuration can be changed after the manufacture of a field-programmable gate array (FPGA) or the like, and a dedicated electric circuit which is a processor having a circuit configuration specifically designed for executing specific processing such as an application specific integrated circuit (ASIC) or the like. In addition, the image processing may also be executed by one of these various processors or by a combination of two or more processors of the same or different types (for example, a plurality of FPGAs and combinations of CPUs and FPGAs). Further, specifically, the electric circuit obtained by combining circuit elements, such as semiconductor elements, can be used as the hardware structure of these various processors.

In the above-described embodiment, the aspect in which the image processing program 50 is stored (installed) in the storage portion 46 has been described, but the present invention is not limited thereto. The image processing program 50 may be provided in a form recorded on a recording medium, such as a compact disk read only memory (CD-ROM), a digital versatile disk read only memory (DVD-ROM), or a universal serial bus (USB) memory, and then provided. In addition, the image processing program 50 may be downloaded from an external device via the network.

EXPLANATION OF REFERENCES

- 10: image exposure device
- 12: image display device
- 13: pixel
- 14: photosensitive recording medium, 14A: exposure surface
- 15: point light source
- 16: louver film, 16A: planar surface of louver film, 16B: side surface of louver film
- 17: protective layer
- 18: film pack
- 20: case
- 21: support portion
- 22: exposure opening
- 26: glass window
- 30: controller
- 32: display portion
- 40: CPU
- 42: memory
- 46: storage portion
- 48: input portion
- 49: bus
- 50: image processing program
- 102: light transmitting portion
- 104: light shielding portion
- 106: light shielding member
- 118: first layer, 118A: planar surface of first layer
- 119: second layer, 119A: planar surface of second layer
- E: high-frequency component (edge portion)
- H: height
- M1 to M3: range
- P: pitch of light shielding portion
- Q: width
- t: thickness of louver film

What is claimed is:

1. An image exposure device comprising:
    an image display device that has a plurality of pixels and radiates light according to a display image represented by the plurality of pixels;
    a support portion that supports a photosensitive recording medium for recording a recorded image according to the display image in a state in which an exposure surface of the photosensitive recording medium faces the image display device;
    a limiting member that is provided between the image display device and the support portion and limits an angle of the light radiated from the image display device to the photosensitive recording medium; and
    a controller that controls the image display device to perform a digital image processing on pixels of the display image to deteriorate an image quality of an input image represented by input image data by emphasizing a density difference of a high-frequency component of the input image,
    wherein the controller emphasizes the density difference of the high-frequency component by unsharp mask processing, and
    wherein in a case where y represents a weight of the unsharp mask processing and x represents a standard deviation of a degree of a two-dimensional Gaussian distribution used for the unsharp mask processing, the following expression (1) is satisfied, $$-0.1 \times x + 0.40 \leq y \leq -0.1 \times x + 0.90 \qquad (1).$$

2. The image exposure device according to claim 1, wherein the display image is an image in which an edge is emphasized more than the recorded image.

3. The image exposure device according to claim 2, wherein the limiting member is an optical member of a diffusion optical system.

4. The image exposure device according to claim 3, wherein the optical member is a louver film in which first light transmitting portions that transmit light and first light shielding portions that shield light are alternately disposed in a first direction on a surface parallel to a surface where the pixels of the image display device are arranged, and second light transmitting portions that transmit light and second light shielding portions that shield light are alternately disposed in a second direction on the surface perpendicular to the first direction.

5. The image exposure device according to claim 1, wherein the controller performs the unsharp mask processing weighted according to a resolution of the image display device.

6. The image exposure device according to claim 5, wherein in a case where X pixel per inch (ppi) represents a resolution of the image display device, the following expression (2) is satisfied, $$-0.1 \times x \times (X \div 325) + 0.40 \leq y \leq -0.1 \times x \times (X \div 325) + 0.90 \qquad (2).$$

7. The image exposure device according to claim 1, wherein in a case where X pixel per inch (ppi) represents a resolution of the image display device, the following expression (2) is satisfied, $$-0.1 \times x \times (X \div 325) + 0.40 \leq y \leq -0.1 \times x \times (X \div 325) + 0.90 \qquad (2).$$

8. The image exposure device according to claim 1, wherein the limiting member is an optical member of a diffusion optical system.

9. The image exposure device according to claim 8, wherein the optical member is a louver film in which first light transmitting portions that transmit light and first light shielding portions that shield light are alternately disposed in a first direction on a surface parallel to a surface where the pixels of the image display device are arranged, and second light transmitting portions that transmit light and second light shielding portions that shield light are alternately disposed in a second direction on the surface not parallel to the first direction.

10. The image exposure device according to claim 9, wherein the louver film is formed by laminating a first layer in which the first light transmitting portions and the first light shielding portions are alternately disposed only in the first direction, and a second layer in which the second light transmitting portions and the second light shielding portions are alternately disposed only in the second direction.

11. The image exposure device according to claim 9,
wherein a thickness of the louver film is 2.0 mm or more and 4.0 mm or less, and
wherein a louver pitch of the louver film is 80 µm or less.

12. The image exposure device according to claim 1,
wherein the limiting member is disposed at a predetermined distance apart from the photosensitive recording medium.

13. The image exposure device according to claim 12,
wherein the predetermined distance is 0.67 mm or less.

14. An image exposure method in an image exposure device including an image display device that has a plurality of pixels and radiates light according to a display image represented by the plurality of pixels, a support portion that supports a photosensitive recording medium for recording a recorded image according to the display image in a state in which an exposure surface of the photosensitive recording medium faces the image display device, and a limiting member that is provided between the image display device and the support portion, and limits an angle of the light radiated from the image display device to the photosensitive recording medium, the method comprising:

controlling the image display device to perform a digital image processing on pixels of the display image to deteriorate an image quality of an input image represented by input image data by emphasizing a density difference of a high-frequency component of the input image, wherein the density difference of the high-frequency component is emphasized by unsharp mask processing, and wherein in a case where y represents a weight of the unsharp mask processing and x represents a standard deviation of a degree of a two-dimensional Gaussian distribution used for the unsharp mask processing, the following expression (1) is satisfied, $$-0.1 \times x + 0.40 \leq y \leq -0.1 \times x + 0.90 \tag{1}.$$

15. A non-transitory computer readable medium for storing a program for causing a computer to execute a process, the computer controlling an image exposure device including an image display device that has a plurality of pixels and radiates light according to a display image represented by the plurality of pixels, a support portion that supports a photosensitive recording medium for recording a recorded image according to the display image in a state in which an exposure surface of the photosensitive recording medium faces the image display device, and a limiting member that is provided between the image display device and the support portion, and limits an angle of the light radiated from the image display device to the photosensitive recording medium, the process comprising:

controlling the image display device to perform a digital image processing on pixels of the display image to deteriorate an image quality of an input image represented by input image data by emphasizing a density difference of a high-frequency component of the input image, wherein the density difference of the high-frequency component is emphasized by unsharp mask processing, and wherein in a case where y represents a weight of the unsharp mask processing and x represents a standard deviation of a degree of a two-dimensional Gaussian distribution used for the unsharp mask processing, the following expression (1) is satisfied, $$-0.1 \times x + 0.40 \leq y \leq -0.1 \times x + 0.90 \tag{1}$$

* * * * *